US007439814B2

(12) United States Patent
Happer et al.

(10) Patent No.: US 7,439,814 B2
(45) **Date of Patent: *Oct. 21, 2008**

(54) METHOD AND SYSTEM FOR OPERATING AN ATOMIC CLOCK WITH SIMULTANEOUS CONTROL OF FREQUENCY AND MAGNETIC FIELD

(75) Inventors: William Happer, Princeton, NJ (US); Yuan-Yu Jau, Princeton, NJ (US); Fei Gong, Princeton, NJ (US)

(73) Assignee: Princeton University, Princeton, NJ (US)

( * ) Notice: Subject to any disclaimer, the term of this patent is extended or adjusted under 35 U.S.C. 154(b) by 38 days.

This patent is subject to a terminal disclaimer.

(21) Appl. No.: 11/509,357

(22) Filed: Aug. 24, 2006

(65) Prior Publication Data

US 2007/0075794 A1 Apr. 5, 2007

Related U.S. Application Data

(60) Provisional application No. 60/710,768, filed on Aug. 24, 2005.

(51) Int. Cl.
*H03L 7/26* (2006.01)
*G01V 3/00* (2006.01)

(52) U.S. Cl. .......................... 331/3; 331/94.1; 324/302; 324/304

(58) Field of Classification Search ..................... 331/3, 331/94.1; 324/302, 304
See application file for complete search history.

(56) References Cited

U.S. PATENT DOCUMENTS

| | | | | |
|---|---|---|---|---|
| 6,888,780 | B2 * | 5/2005 | Happer et al. | 368/10 |
| 6,919,770 | B2 | 7/2005 | Happer et al. | 331/94 |
| 2005/0212607 | A1 | 9/2005 | Happer et al. | 331/94.1 |

OTHER PUBLICATIONS

Bell et al., Physical Review Letters, "Optically Driven Spin Precession", vol. 6, No. 6, pp. 280-281, (1961).
Miron et al., Physical Review Letters, "Push-Pull Optical Pumping of Pure Superposition States", vol. 93, No. 16, pp. 160802-1 to 160802-4, (2004).

* cited by examiner

*Primary Examiner*—Arnold Kinkead
(74) *Attorney, Agent, or Firm*—Mathews, Shepherd, McKay & Bruneau, P.A.

(57) ABSTRACT

The present invention relates to a method and system in which multi-coherent resonances of a microwave in which the alkali-metal atoms in the ground state are driven simultaneously by a microwave hyperfine frequency $\Omega_H$ and a Zeeman frequency $\Omega_Z$. The driving influences on the atom can include magnetic fields or by optically pumping light modulated by a Zeeman frequency $\Omega_Z$ or a microwave hyperfine frequency $\Omega_H$ or by combinations of their harmonics or subharmonics. Multi-coherent resonances permit simultaneous measurement or control of the ambient magnetic field and measurement or control of a hyperfine resonance frequency of alkali-metal atoms. In one embodiment, the hyperfine frequency for a controlled magnetic field can serve as an atomic clock frequency.

36 Claims, 7 Drawing Sheets

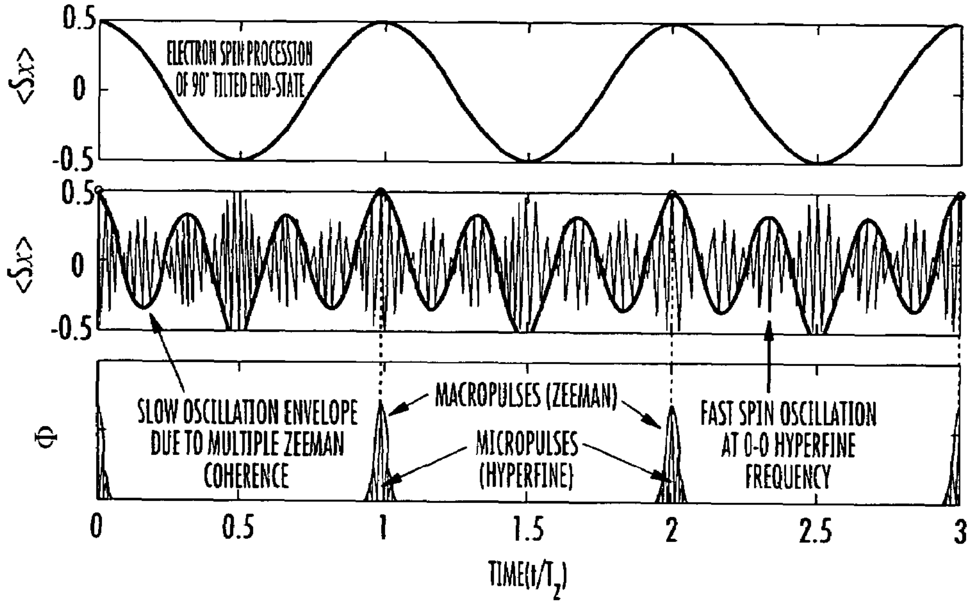
FIG. 3A
FIG. 3B
FIG. 3C
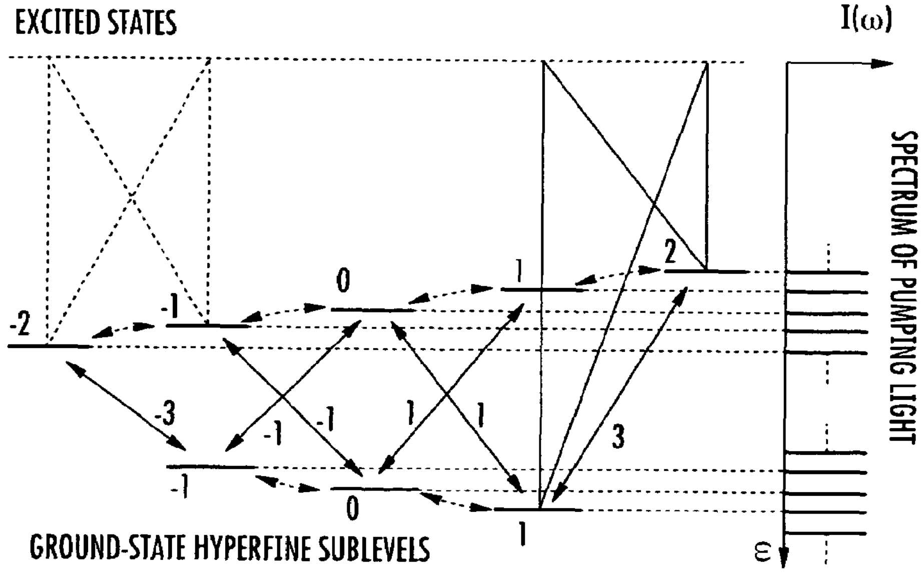
FIG. 3D

METHOD AND SYSTEM FOR OPERATING AN ATOMIC CLOCK WITH SIMULTANEOUS CONTROL OF FREQUENCY AND MAGNETIC FIELD

CROSS REFERENCE TO RELATED APPLICATION

This application claims priority to U.S. Provisional Application No. 60/710,768, filed on Aug. 24, 2005, the disclosure of which is hereby incorporated by reference in its entirety.

STATEMENT OF GOVERNMENT FUNDED RESEARCH

This work was supported by the Air Force Office Scientific Research F49620-01-1-0297. Accordingly, the Government has certain rights in this invention.

BACKGROUND OF THE INVENTION

1. Field of the Invention

The present invention relates to the field of optically pumped atomic clocks or magnetometers, and more particularly to atomic clocks or magnetometers that operate by exciting multi-coherent resonances using pumping of light of appropriate modulation format such as alternating polarization referred to as push-pull pumping.

2. Description of the Related Art

Conventional, gas-cell atomic clocks utilize optically pumped alkali-metal vapors. Atomic clocks are utilized in various systems that require extremely accurate frequency measurements. For example, atomic clocks are used in GPS (global positioning system) satellites and other navigation and positioning systems, as well as in cellular phone systems, radio communications, scientific experiments and military applications. A design similar to that of an atomic clock is also utilized as a magnetometer, since some of the atomic resonances are highly sensitive to the magnetic field.

In one type of atomic clock, a cell containing an active medium, such as rubidium or cesium vapor, is irradiated with both optical and microwave power. The cell contains a few droplets of alkali metal and an inert buffer gas (such as $N_2$, any of the noble gases, or a mixture thereof) at a fraction of an atmosphere of pressure. Light from the optical source pumps the atoms of the alkali-metal vapor from a ground state to an optically excited state, from which the atoms fall back to the ground state, either by emission of fluorescent light or by quenching collisions with a buffer gas molecule such as $N_2$. The wavelength and polarization of the light are chosen to ensure that some ground state sublevels are selectively depopulated, and other sublevels are overpopulated compared to the normal, nearly uniform distribution of atoms between the sublevels. The resonant transitions (or resonances) between these sublevels can be excited by the microwaves. It is also possible to excite the same resonances by modulating the light at the Bohr frequency of the resonance (a method currently known as coherent population trapping, or CPT), as first pointed out by Bell and Bloom, W. E. Bell, and A. L. Bloom, Phys. Rev. Lett. 6, 280 (1961), hereby incorporated by reference into this application. The changes in the population distributions of the ground state of alkali-metal atoms, introduced by the resonance, lead to a change in the transparency of the vapor, so a different amount of light passes through the vapor to a photo detector that measures the transmission of the pumping beam, or to photo detectors that measure fluorescent light scattered out of the beam. When an applied magnetic field, produced by the microwaves, oscillates with a frequency equal to one of the Bohr frequencies of the atoms, the populations of the ground-state sublevels are perturbed and the transparency of the vapor changes. If excitation by the modulated light (CPT) is used instead of the microwaves, a coherent superposition state of the ground-state sublevels is generated when the light modulation frequency or one of its harmonics matches one of the Bohr frequencies of the atoms. The changes in the transparency of the vapor are used to lock a clock or a magnetometer to the Bohr frequencies of the alkali-metal atoms.

The Bohr frequencies of a gas-cell atomic clock are the frequencies v with which the electron spin S and the nuclear spin I of an alkali-metal atom precess about each other and about an external magnetic field. For the ground state, the precession is caused by magnetic interactions. Approximate clock frequencies are v=6.835 GHz for $^{87}$Rb and v=9.193 GHz for $^{133}$CS. Conventionally, clocks have used the "0-0" resonance which is the transition between an upper energy level with azimuthal quantum number m=0 and total angular momentum quantum number F=a=I+½, and a lower energy level, also with azimuthal quantum number m=0 but with total angular momentum quantum number F=b=I−½.

Because of advances in the technology of diode lasers, there is an increasing interest in replacing the conventional atomic-resonance pumping lamps of atomic clocks with compact diode lasers. Diode lasers can be readily modulated, so it may be possible eliminate the microwave cavities and microwave field sources used to drive the 0-0 hyperfine resonance of traditional atomic clocks by using coherent population trapping (CPT) resonances, as described in H. R. Gray, R. M. Whitley, and C. R. Stroud, Opt. Lett. 3, 218 (1978), excited by diode lasers modulated at the 0-0 hyperfine frequency of the ground-state alkali-metal atom or a sub-harmonic thereof, as described in J. Vanier, M. W. Levine, D. Janssen, and M. Delaney, Phys. Rev. A 67, 065801 (2003). This type of CPT resonance has been used in atomic magnetometers, as described in S. J. Seltzer and M. V. Romalis, Appl. Phys. Lett. 85, 4804 (2004).

It has been found that the observed changes of transmitted or fluorescent light when the 0-0 resonance is excited and probed by frequency-modulated light become too small for practical use at buffer-gas pressures exceeding a few hundred torr as described in D. E. Nikonov et al., Quantum Opt. 6, 245 (1994). Broadening of the optical absorption lines degrades the CPT signals generated with frequency modulated light in much the same way, and for analogous reasons, as decreasing the Qs (quality factors) of the two tuned circuits degrades the performance of phase-shift discriminators of FM radio or television receivers. The population concentration in the end state and the suppression of the 0-0 resonance also occurs when the pumping is done with unmodulated light of fixed circular polarization, and it is independent of whether the resonances are excited by microwaves, or with the circularly polarized light that is frequency-modulated at $v_0/2$, half the 0-0 frequency.

Conventional CPT atomic clock systems have used modulated light of fixed polarization. It has been found that much less degradation of the 0-0 CPT resonances with increasing buffer gas pressure occurs if light of fixed circular polarization is intensity-modulated at the frequency vo instead of being frequency-modulated at $v_0/2$.

The CPT signal with pulsed light of fixed circular-polarization at very high buffer-gas pressure has about the same amplitude as the CPT signal at low pressures with frequency-modulated light. In both cases, the small signal amplitude is due to the accumulation of most of the atoms in the end state.

The suppression of the 0-0 CPT signal due to optical pumping has been discussed in J. Vanier, M. W. Levine, D. Janssen, and M. Delaney, Phys. Rev. A 67, 065801(2003).

It is desirable to provide a method and system to permit the use of any alkali-metal isotope in conventional clocks, optically pumped in a conventional manner using miniature resonance lamps instead of using lasers by using multi-coherent resonances excited with multi-quantum microwave transitions.

SUMMARY OF THE INVENTION

The present invention relates to a method and system in which multi-coherent resonances in alkali-metal atoms in the ground state are driven simultaneously by a microwave hyperfine frequency $\Omega_H$ and a Zeeman frequency $\Omega_Z$. The driving influences on the atom can include magnetic fields or by optically pumping light modulated by a Zeeman frequency $\Omega_Z$ or a microwave hyperfine frequency $\Omega_H$ or by combinations of their harmonics or subharmonics. Multi-coherent resonances permit simultaneous measurement or control of the ambient magnetic field and measurement or control of a hyperfine resonance frequency of alkali-metal atoms. In one embodiment, the hyperfine frequency for a controlled magnetic field can serve as an atomic clock frequency.

In one embodiment, the use of multi-coherent resonances with the coherent population trapping (CPT) resonance of a tilted 0-0 state, the vapor can become transparent for light propagating through an alkali-metal vapor at right angles to small magnetic field, for example $\leqq 1$ Gauss, if the light is intensity modulated at the Zeeman frequency $\omega_z$ and if the circular polarization of the light alternates in sign at the frequency $\omega_h$. This generates a "tilted 0-0 state that is nearly transparent to the pumping light.

The invention will be more fully described by reference to the following drawings.

BREIF DESCRIPTION OF THE DRAWINGS

Figures 2A, 2B, 2C, 2D:
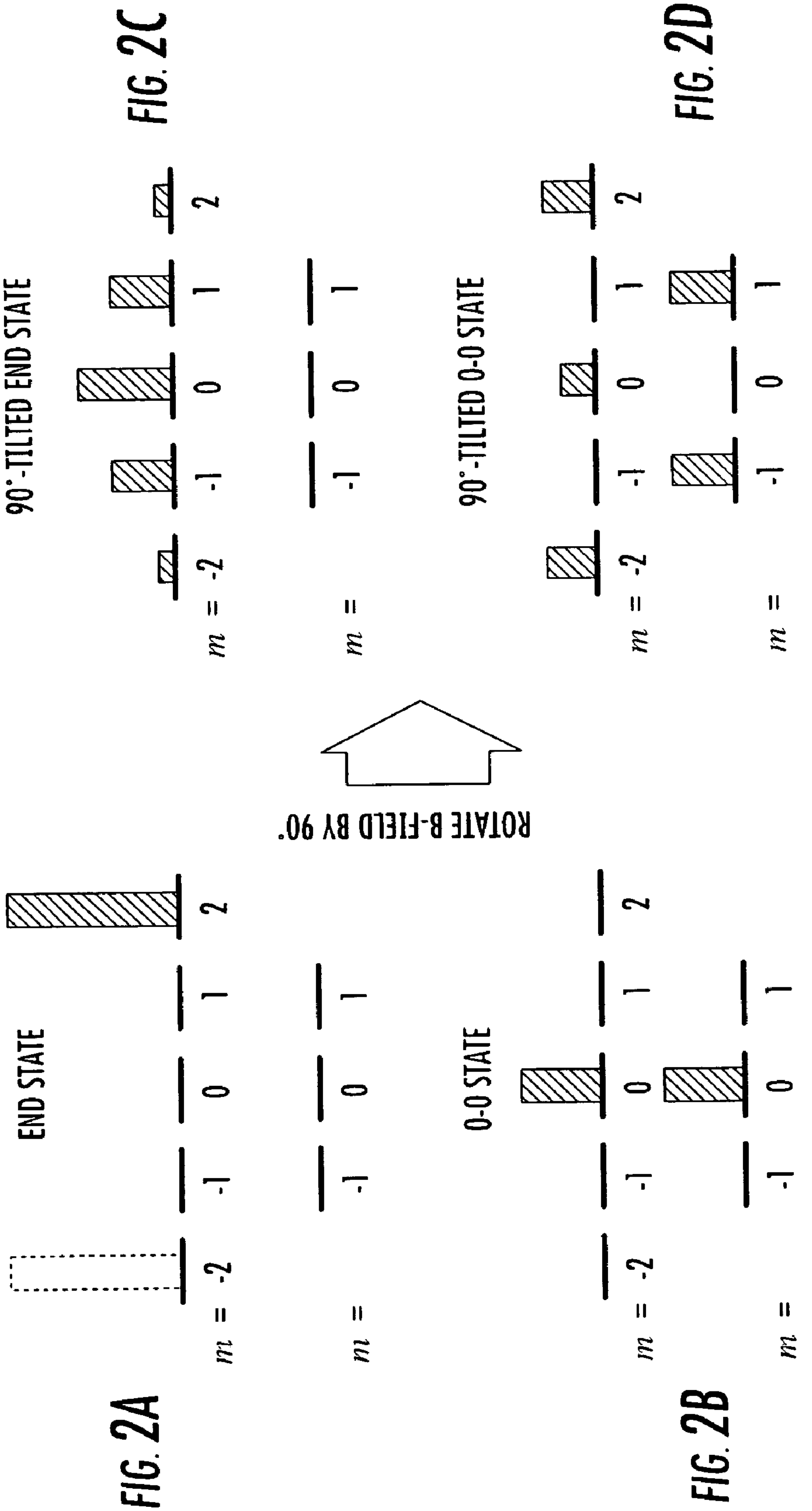
FIG. 2A illustrates pumping most of the atoms into the right or left end states of an alkali-metal atom with light of fixed circular polarization.
FIG. 2B illustrates pumping most of the atoms into a coherent 0-0 state with light for which the circular polarization of the light alternates at the 0-0 hyperfine resonance frequency. This is called push-pull pumping.
FIG. 2C illustrates the result of rotating the end state of FIG. 2A by 90 degrees away from the original symmetry axis. This "tilted end state" can be produced by pumping with circular polarized light that is propagating at right angles to the magnetic field and which is modulated at the Zeeman resonance frequency $\Omega_Z$.

FIG. 2D illustrates the result of rotating the 0-0 superposition state of FIG. 2B by 90 degrees away from the original symmetry axis. This "tilted 0-0 state" can be produced by pumping with light for which the circular polarization alternate in sign at the microwave hyperfine frequency $\Omega_H$, like that of the push-pull pumping of FIG. 2B, and is simultaneously intensity modulated at the Zeeman frequency $\Omega_Z$, like the light of FIG. 2C.

FIG. 3A is a graph of expectation value of the electron spin $\langle S_x \rangle$ for an alkali-metal atom with I=3/2 for a tilted end state like that of FIG. 2C FIG. 3B is a graph of expectation value of the electron spin $\langle S_x \rangle$ for an alkali-metal atom with I=3/2 for a tilted 0-0 state like that of FIG. 2D.

FIG. 3C is a schematic diagram of the photon flux $\Phi$ of pumping light that consists of short micropulses, alternating in their circular polarization at the 0-0 hyperfine frequency $\Omega_H$ and pulsed on and off at the Zeeman frequency $\Omega_Z$. This is the type of pumping light needed to generate the tilted 0-0 state of FIG. 2D FIG. 3D is a schematic diagram of the optical frequency spectrum and representative Raman transitions.

Figure 4A:
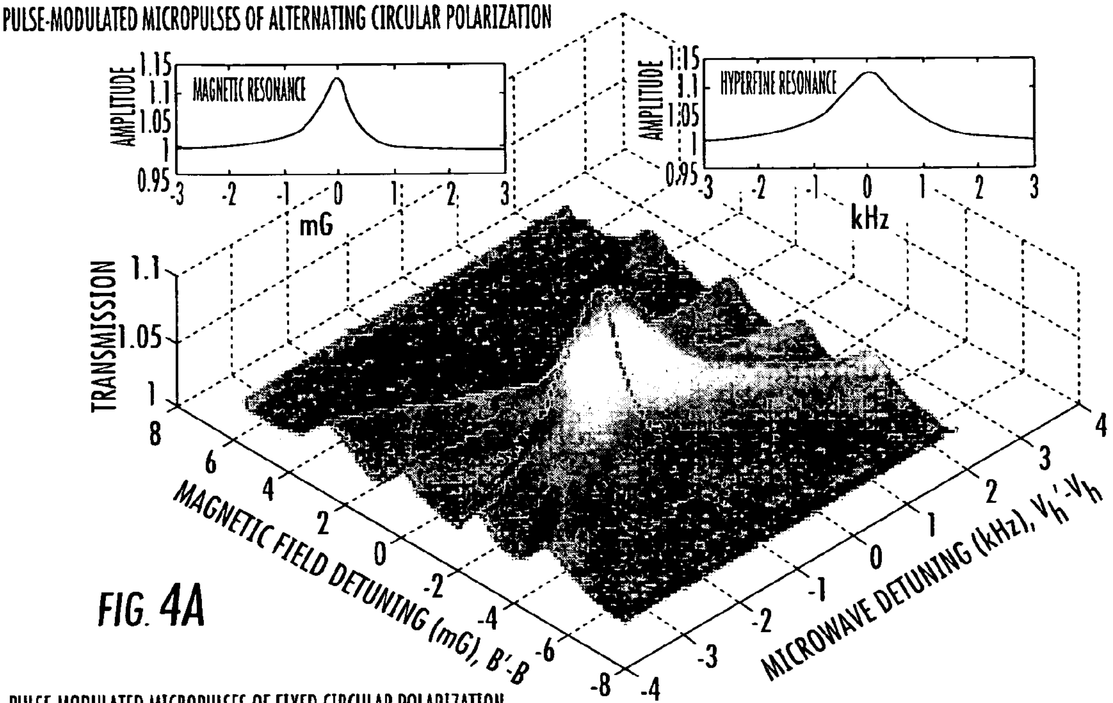

FIG. 4A is a schematic diagram of experimental CPT resonances for the tilted 0-0 state. Shown is the experimentally measured mean intensity of light that passes through an cell with alkali-metal vapor that is optically pumped with light modulated as sketched in FIG. 3D. One horizontal axis is proportional to the detuning of the hyperfine drive frequency $\Omega_H$ from the hyperfine resonance frequency $\omega_h$. The second horizontal axis is proportional to the detuning of the Zeeman drive frequency $\Omega_Z$ from the Zeeman resonance frequency $\omega_z$. The sharp, two-dimensional resonance can be used to stabilize a magnetic field and a clock frequency simultaneously.

Figure 4B:
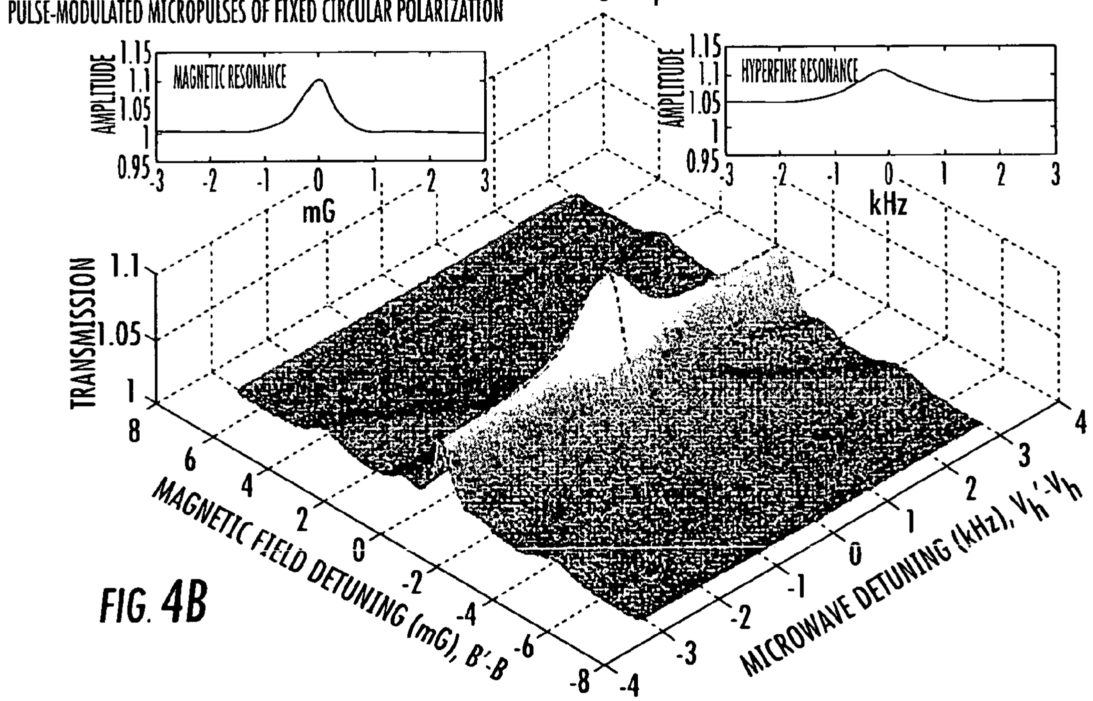

FIG. 4B is a schematic diagram of the resonances produced when every other micropulse of the push-pull pumping beam of FIG. 4A is eliminated. The two-dimensional resonance is much less sharp, since the modulated light of fixed polarization tends to produce the tilted end state of FIG. 2C rather than the tilted 0-0 state of FIG. 2D.

Figure 5:
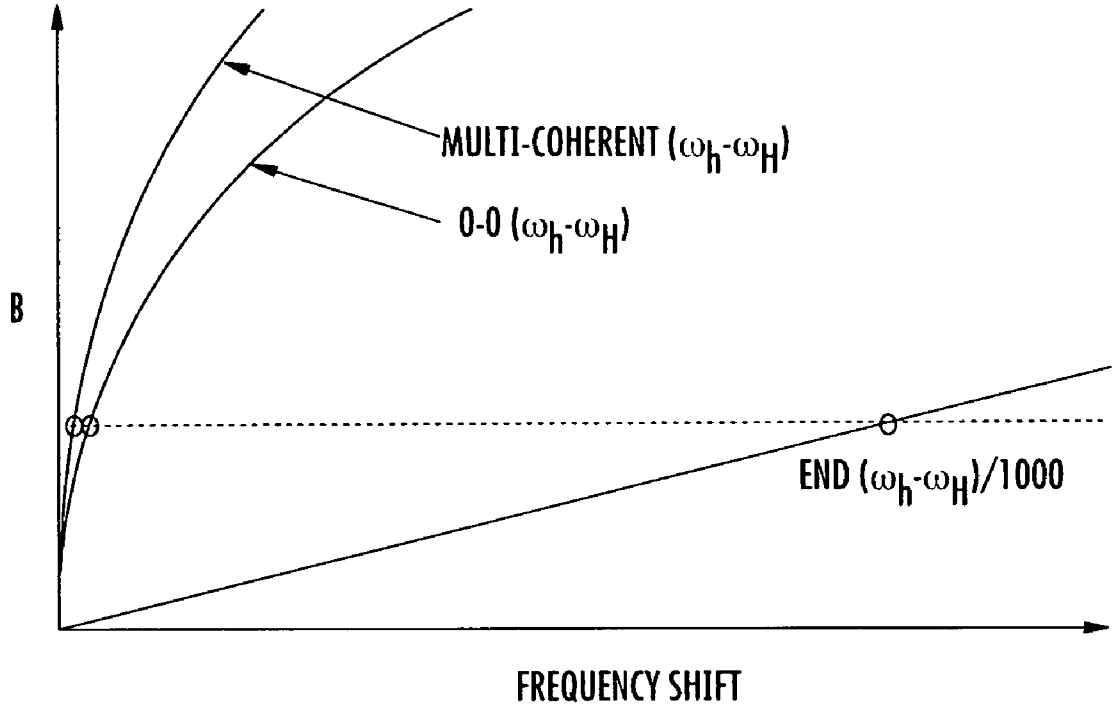

FIG. 5 is a graph of dependence on magnetic field B of the resonant frequency $\omega_h$ for three types of atomic clock resonances in an alkali-metal vapor: a conventional 0-0 resonance, a multi-coherent resonance, and an end resonance The multi-coherent clock, the subject of this disclosure, has the smallest dependence on the magnetic field.

Figure 6A:
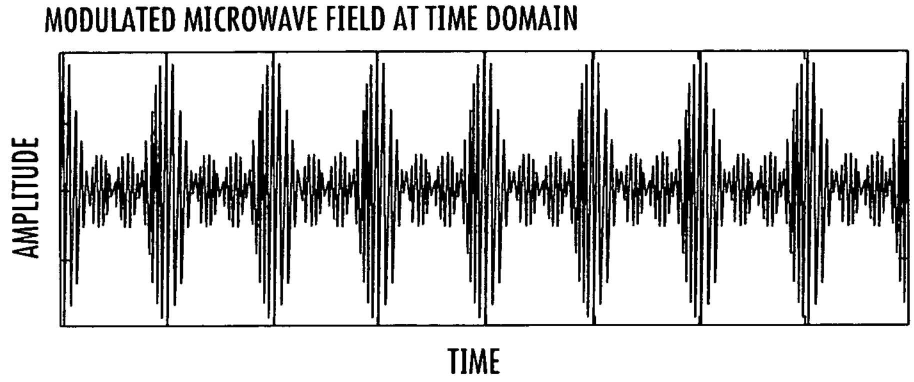

FIG. 6A is a schematic diagram of the time-domain spectrum of microwave field B1 produced by multi-coherent resonances excited by multi-quantum transitions produced by series of microwave frequencies.

Figure 6B:
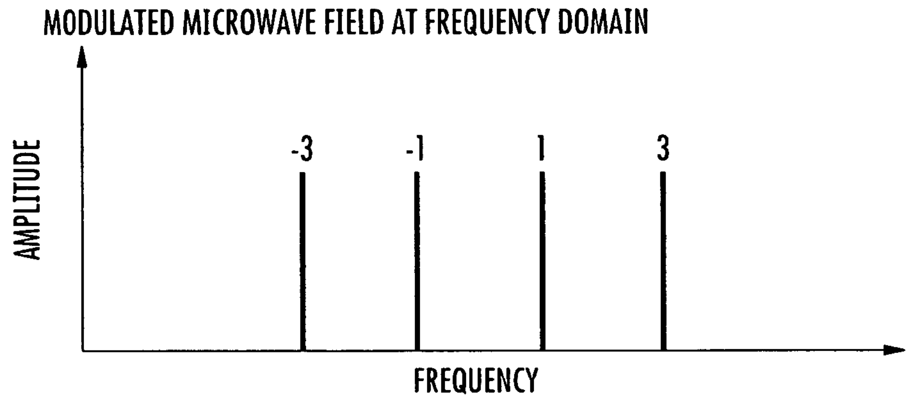

FIG. 6B is a schematic diagram of sidebands produced by the field being modulated at the Zeeman frequency to suppress the carrier frequency $\Omega_H$ and produce four sidebands of frequencies $\Omega_H \pm 3\Omega_A$ and $\Omega_H \pm \Omega_A$.

Figure 6C:
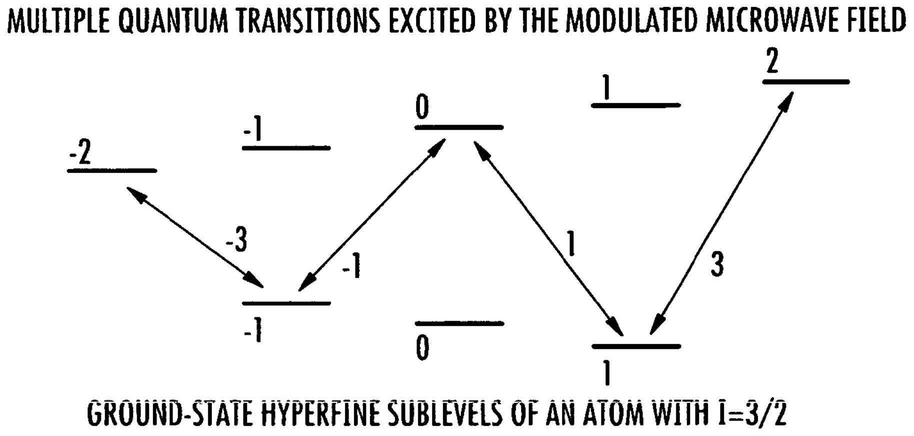

FIG. 6C is a schematic diagram illustrating that the sidebands drive a four-quantum resonance, taking atoms from the right end state of maximum spin and minimum absorption of the right-circularly-polarized pumping light to the left end state of minimum spin and maximum light absorption.

Figure 7:
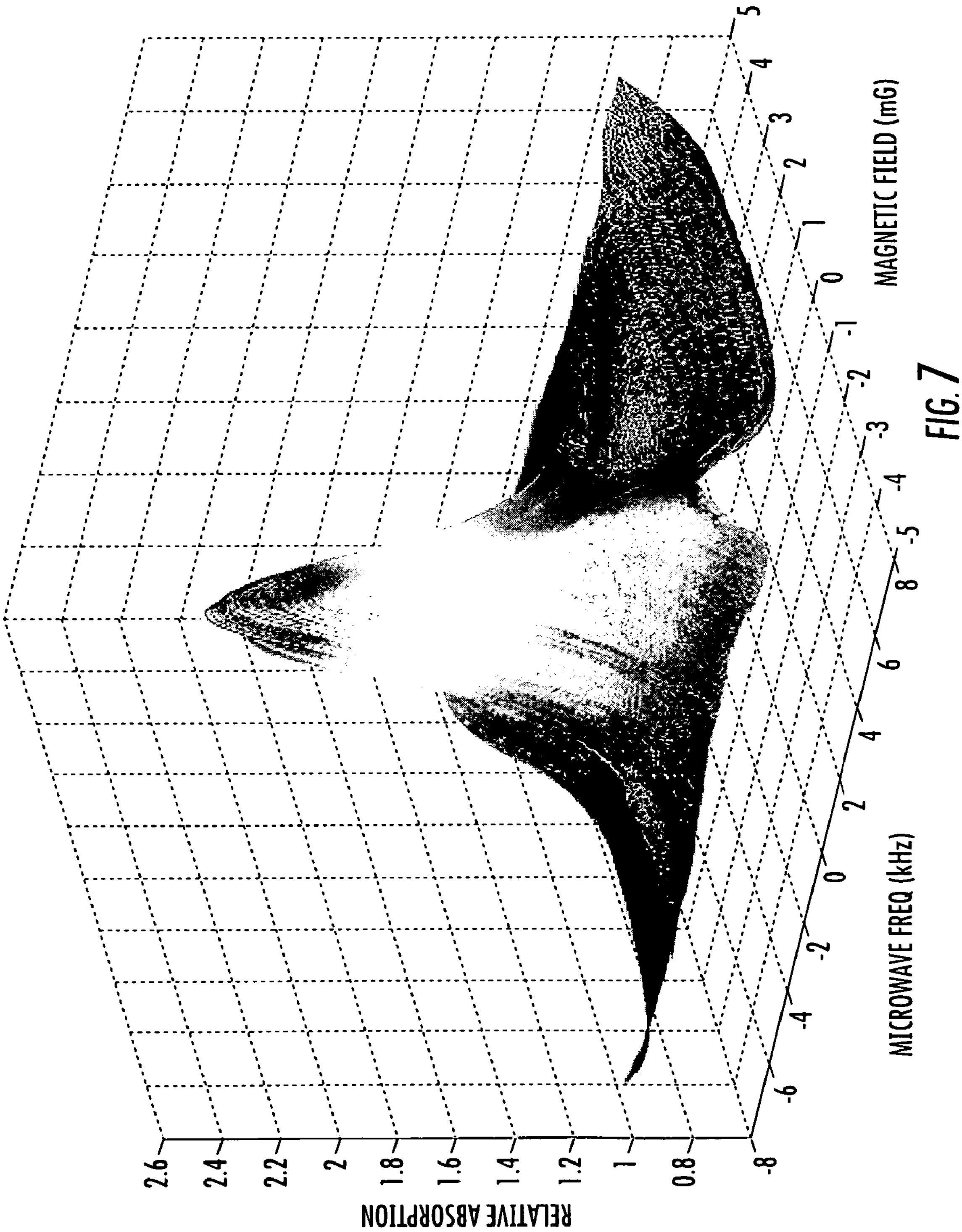

FIG. 7 illustrates a graph of experimental data on multi-coherent resonances excited by multiple-quantum magnetic resonance transitions in $^{133}$Cs vapor. One axis is the detuning of the hyperfine frequency and the other is the detuning of the magnetic field.

DETAILED DESCRIPTION

Reference will now be made in greater detail to a preferred embodiment of the invention, an example of which is illustrated in the accompanying drawings. Wherever possible, the same reference numerals will be used throughout the drawings and the description to refer to the same or like parts.

Figure 1:
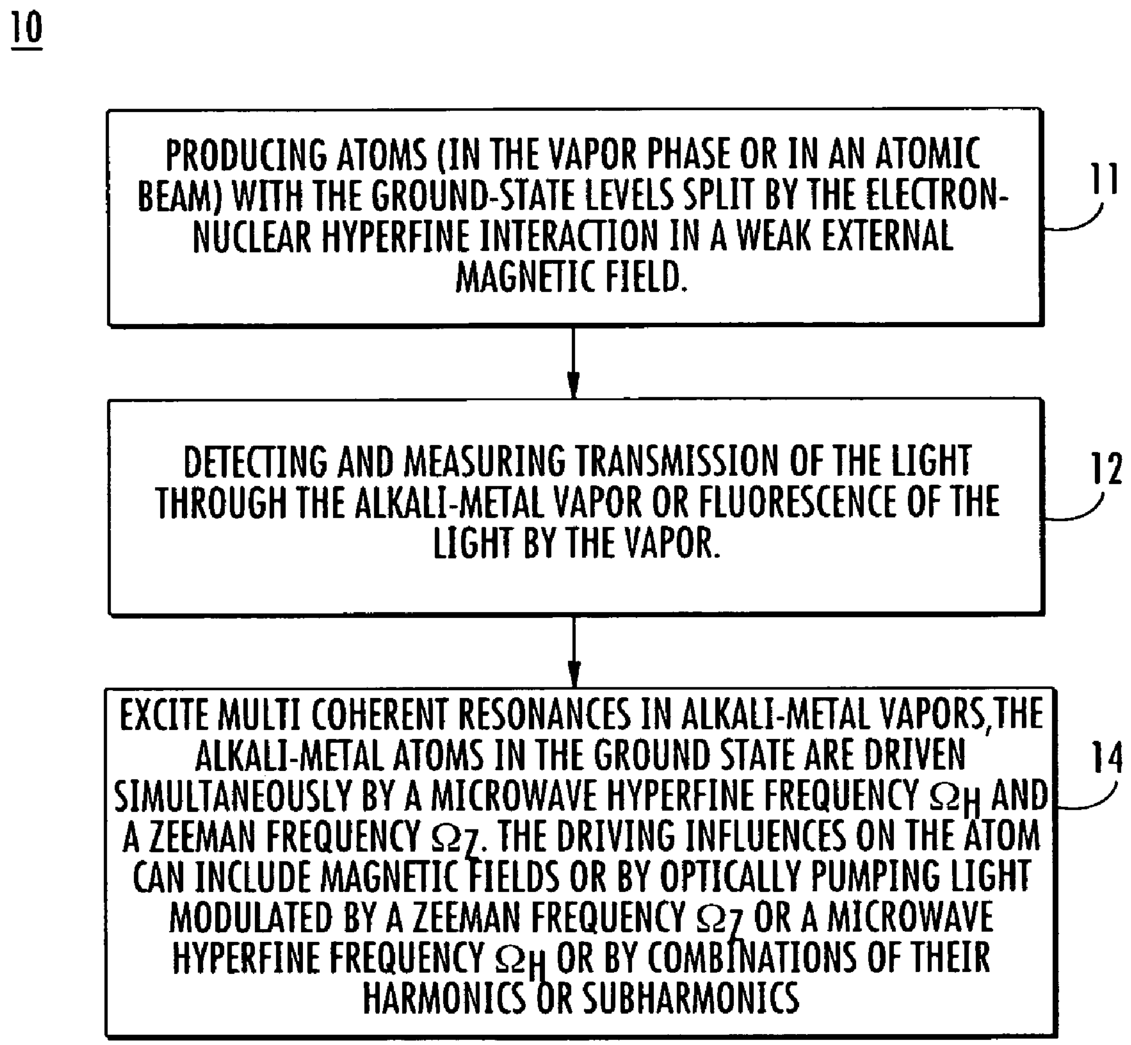
FIG. 1 is a flow diagram of a method for operating an atomic clock or magnetometer in accordance with the teachings of the present invention.

FIG. 1 is a flow diagram of a method for operating an atomic clock or magnetometer 10 in accordance with the teachings of the present invention. In block 11, atoms are generated in a vapor phase or in an atomic beam, their ground state split by the electron-nuclear hyperfine interaction. The atomic vapor can be mixed with a buffer gas or gases, such as nitrogen or any of the noble gases, or a mixture thereof. A weak external magnetic field is needed to define the quantization direction at the location of the atoms.

In block 12, to excite multi coherent resonances in alkali-metal vapors, the alkali-metal atoms in the ground state are driven simultaneously at a microwave hyperfine frequency $\Omega_H$ and a Zeeman frequency $\Omega_Z$. The driving influences on the atom can include magnetic fields or optically pumping light modulated by a Zeeman frequency $\Omega_Z$ or a microwave hyperfine frequency $\Omega_H$ or by combinations of their harmonics or subharmonics. In a first embodiment, magnetic resonance is used to drive multi-coherent resonances in which magnetic fields oscillating at microwave hyperfine frequencies $\Omega_H$ and the Zeeman frequency $\Omega_Z$ are used. In a second embodiment, coherent population trapping (CPT) resonances are used to drive multi-coherent resonances in which light modulated at microwave hyperfine frequencies $\Omega_H$ and the Zeeman frequency $\Omega_Z$ is used. For example, the microwave hyperfine frequencies $\Omega_H$ can be a few GHz and the Zeeman frequency $\Omega_Z$ can be a few hundred kHz or less.

Multi-coherent resonances permit simultaneous measurement or control of the ambient magnetic field and measurement or control of a hyperfine resonance frequency of alkali-metal atoms. In one embodiment, the hyperfine frequency for a controlled magnetic field can serve as an atomic clock frequency.

For applications in atomic clocks, the Zeeman frequency can be a large integer subharmonic of the hyperfine frequency, for example $\Omega_H=100{,}000\ \Omega_Z$. Then the controlled variables can be the microwave or "clock" frequency $\Omega_H$ and the magnetic field B to which the atoms are exposed.

The system has a maximum resonant response to these drive frequencies when $\Omega_H=\omega_h$ and $\Omega_Z=\omega_z$. The Zeeman resonance frequency, $\omega_z$ is proportional to the magnetic field B. The hyperfine resonance frequency $\omega_h$ will differ from the ideal 0-0 hyperfine frequency of a field-free atom by a small amount, proportional to the square of the magnetic field.

In one embodiment, optical pumping can be performed with light of alternating polarization. The light of alternating polarization provides photons having spin that alternates its direction at a hyperfine frequency of the atoms at the location of the atoms. Light of alternating polarization is defined within the scope of this invention as an optical field, the electric field vector of which or some component thereof at the location of the atoms alternates at a hyperfine frequency of the atoms between rotating clockwise and rotating counter-clockwise in the plane perpendicular to the magnetic field direction, as described in U.S. patent application Ser. No. 11/052,261 hereby incorporated by reference into this application. In one embodiment, the polarization of the light interacting with the atoms alternates from magnetic right circular polarization (mRCP) to magnetic left circular polarization (mLCP). mRCP light is defined as light for which the mean photon spin points along the direction of the magnetic field so that an absorbed photon increases the azimuthal angular momentum of the atom by 1 (in units of h). mLCP is defined as light for which the mean photon spin points antiparallel to the direction of the magnetic field so that an absorbed photon decreases the azimuthal angular momentum of the atom by 1 (in units of h). For light beams propagating antiparallel to the magnetic field direction, mRCP and mLCP definitions are equivalent to the commonly used RCP and LCP definitions, respectively. However, for light beams propagating along the magnetic field direction, mRCP is equivalent to LCP, and mLCP is equivalent to RCP.

In one embodiment, block 12 is performed by intensity or frequency modulating right circularly polarized (RCP) light at a repetition frequency equal to the frequency of the 0-0 resonance and combining it with similarly modulated left circularly polarized (LCP) light which is shifted or delayed relative to the RCP light by a half-integer multiple of the repetition period. Alternatively, the light of alternating polarization is generated by combining two beams of mutually perpendicular linear polarizations, wherein optical frequencies of the beams differ from each other by a hyperfine frequency of the atoms. Alternatively, the light of alternating polarization is generated by two counter-propagating beams that produce the electrical field vector at the location of the atoms which alternates at a hyperfine frequency of the atoms between rotating clockwise and rotating counter-clockwise in the plane perpendicular to the light propagation. Alternatively, the light of alternating polarization is generated by a system of spectral lines, equally spaced in frequency by a hyperfine frequency of the atoms wherein each spectral line is linearly polarized and the polarizations of adjacent lines are mutually orthogonal. Alternatively, the light of alternating polarization is generated by generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms.

The ground-state energy sublevels of an alkali-metal atom can be denoted by $|fm\rangle$, with the energies $E_{fm}$. The quantum number for the total ground-state angular momentum is $f=a=I+\frac{1}{2}$ or $f=b=I-\frac{1}{2}$ where I is the nuclear spin quantum number. The total angular momentum operator is denoted F=S+I, the sum of the electron spin operator S and the nuclear-spin operator I. The azimuthal quantum number is m, with the z axis defined by a small magnetic field B. To second order in B, the Bohr frequency for transitions between the states $|a0\rangle$ and $|b0\rangle$ is $v=v_h+sB^2/v_h$, where the shift coefficient $s=3.92$ kHz $G^{-2}$ GHz and the zero-field frequencies for $^{133}Cs$, $^{87}Rb$ and $^{85}Rb$ are approximately: 9.19 GHz, 6.83 GHz, and 3.04 GHz. Although second-order shifts are small at fields B on the order of one Gauss, the shifts can still be comparable to or larger than the resonance linewidths, typically about 1 kHz. It has been found that the magnetic field must be stabilized to a small fraction of a Gauss to reach the intrinsic performance capability of the atomic clock.

FIGS. 2A-2D illustrate populations of ground-state sublevels for axially symmetric and tilted pure states of an alkali-metal atom with nuclear spin quantum number I=3/2 and tilt angle β=90 degrees. For free atoms with no relaxation mechanisms, the populations of a pure "end state" $|\phi(t)\rangle=|aa\rangle$ (or $|a,-a\rangle$ shown in dashed lines) are indicated in FIG. 2A and the populations of a pure "0-0 state" $|\phi(t)\rangle=|a0\rangle e^{-iEa0t/h}+|b0\rangle e^{iEb0t/h}/\sqrt{2}$ are indicated in FIG. 2B. Both states are axially symmetric, and the end state is independent of the time t. At the time t=0 we can rotate the end state or the 0-0 state by an angle β about the y axis to form the corresponding "tilted" state, $|\psi(0)\rangle=\hat{D}|\phi(0)\rangle$. The rotation operator is $\hat{D}=e^{-i\beta Fy}$. FIG. 2C and FIG. 2D indicate the populations of the tilted states. The initial amplitudes of the sublevels $|fm\rangle$ for the tilted end state shown in FIG. 2C are $\langle fm|\psi(0)\rangle=\delta_{fa}d_{ma}^{a}(\beta)$ where $d_{mm'}^{j}$, (β) denotes a Wigner D-Function. Similarly, the initial amplitudes of the tilted 0-0 state are $\langle fm|\psi_0\rangle=d_{m0}^{f}(\beta)/\sqrt{2}$.

For magnetic fields B on the order of the earth's field (a fraction of one Gauss) or less, the time evolution of a state is given to good approximation by $$|\psi(t)\rangle = \sum_{fm} e^{iE_f^{(0)}t/\hbar} e^{-i\omega_f m t} |fm\rangle\langle fm \mid \psi(0)\rangle \quad (1)$$

Here $E_a^{(0)}=hv_h I/[I]$ and $E_b^{(0)}=hv_h(I+1)/[I]$, with $[I]=2I+1$, are zero-field energies of the multiplet f. The precession frequencies of the upper and lower hyperfine multiplets are equal and opposite in this approximation, with $\omega f=(-1)^{a-f}2\pi v_z$. The Zeeman frequency is $v_z=2.8B/[I]\text{MHzG}^{-1}$. Small corrections to the precession frequencies due to the interaction of the nuclear magnetic moment with B, and due to the slight "quadratic splittings" that are proportional to $B^2$ are not included.

In this embodiment, D1 light, corresponding to resonant excitation of the $^2P_{1/2}$ state of the alkali-metal atom, is used for optical pumping. The absorption cross section for such light is $\sigma=\sigma_0(1-2s\cdot\langle S\rangle)$. The photon spin s of the light is related to the polarization vector e by $s=ie\times e^*$. The expectation value of the electron spin of the atom is $\langle S\rangle=\langle\psi|S|\psi\rangle$ for a pure state with a wave function $|\psi\rangle$ and $\langle S\rangle=\text{Tr}[\rho S]$ for the more general mixed state with density matrix $\rho$. The absorption cross section for unpolarized atoms, $\sigma_0$, depends on the optical frequency $\omega$ and the buffer-gas pressure. The buffer-gas pressure used is large enough that the hyperfine splitting of the optical absorption lines is not resolved.

For a tilted end state $\langle S\rangle=\{(x \cos \omega_z t+y \sin \omega_z t)\sin \beta+z \cos \beta\}/2$, where x, y and z are orthonormal, Cartesian unit vectors. For a tilted 0-0 state and for $I=3/2$ and $\beta=\pi/2$ it is found that $\langle S\rangle=\{[x \cos \omega_z t-y \sin \omega_z t)+3(x \cos 3\omega_z t+y \sin 3\omega_z t)] \cos \omega_h t\}/8$. The time-dependence of the electron spin projection $\langle S_x\rangle$ is plotted schematically in FIG. 3A for the tilted end state and in FIG. 3B for the tilted 0-0 state.

The tilted 0-0 state can be generated by pumping with pulse-modulated, push-pull light, propagating along the x axis. The flux $\Phi$ for this modulation format is shown in FIG. 3C. Push-pull micropulses are separated by half the hyperfine period $T_h=1/v_h$. The circular polarization alternates in sign from micropulse to micropulse. The amplitudes of the micropulses are modulated by "macropulse" envelopes, separated by the Zeeman period $T_z=1/v_z$. A CPT resonance is generated because the time-averaged photon absorption rate, $R=\sigma_0(1-s\cdot\langle S\rangle)\Phi$ is much smaller for the tilted 0-0 state than for any other state. The spectrum of the pulse-modulated push-pull pumping beam has clusters of lines, separated by the hyperfine frequency $v_h$, as shown in FIG. 3D. If the optical carrier frequency $v_c$ is chosen half way between the resonant frequencies for transitions from the lower/upper multiplets of the ground state, the frequencies of lines in the most strongly absorbed clusters are $v_c\pm v_h/2+qv_z$. Possible values of the sideband indices are $q=0, \pm1, \pm2, \ldots$. The photons of the lower cluster have the linear polarization vector $e_+$ and the photons of upper cluster have the orthogonal linear polarization vector e−. The system undergoes resonant stimulated Raman scattering Λ-transitions) as indicated by the solid lines in FIG. 3D that connect two ground-state sublevels through the excited state. A photon of polarization-vector $e_a$ is absorbed and a photon of polarization vector $e_e$ is emitted. The scattering can be represented by an effective, non-Hermitian Hamiltonian operator δH that couples an initial ground-state sublevel $|fm\rangle$ to a final sublevel $|f'm'\rangle$. The matrix elements are $\langle f'm'|\delta H|fm\rangle \propto e_e^* \times e_a \cdot \langle f'm'|S|fm\rangle$. For Raman scattering between Zeeman sublevels of different ($f'\neq f$) hyperfine multiplets, $e_a=e_+$and $e_e=e_$or vice versa. Then $e_e^*\times e_a=\pm x$, and the matrix element for Raman scattering between states with $f'\neq f$ is $\langle f'm'|\delta H|fm\rangle \propto \langle f'm'|S_x|fm\rangle$. The allowed Raman transitions, for pulse-modulated push-pull pumping are sketched as solid lines connecting Zeeman sublevels in FIG. 3D. The transitions are labeled by the difference in the sideband indices, $q_a-q_e=\pm1,\pm3$, needed to conserve energy for photon absorption from the upper multiplet f=a and emission to the lower multiplet f=b.

FIG. 4A illustrates experimental CPT resonances for the tilted 0-0 state. D1 light propagating at right angles to the magnetic field generated CPT resonances in a $^{87}$Rb cell with an optical path length of 2.2 cm. The results were insensitive to small changes in the angle between the pumping beam and the magnetic field. The cell contained 80 torr $N_2$ buffer gas at a temperature of 57° C. As described by Y. Y. Jau et al., Phys. Rev. Lett. 93, 160802 (2004) hereby incorporated by reference into this application, a Mach-Zehnder modulator was used to generate micropulses of the same polarization with a repetition frequency $v'_h$ that could be swept through the microwave resonance frequency $v_h$. The pulse train was split and an optical delay line with appropriate polarizing elements was used to interleave micropulses of opposite circular polarization. The light was also pulse-modulated at the fixed Zeeman frequency $v_z$=74 kHz. The Zeeman envelope had a 2 μsec duration. The average pumping power was about 60 μW at 2 mm beam diameter. A magnetic field B' could be scanned through the resonance value, B=106 mG. Maximum transmission of the pumping light was found at CPT resonance, when $v'_h=v_h$ and B'=B. Two insets in FIG. 4A show the magnetic and hyperfine resonances along the two, zero-detuning axes of the 3D plot. The optical pumping rate was comparable to the spin relaxation rates, so only a fraction of the atoms was pumped into the tilted 0-0 state. The resonance has 12% signal contrast and 1.1 kHz linewidth along the microwave detuning axis. For sufficient detuning of the microwave frequency, a scan of the magnetic field produced four resolved resonances, corresponding to the coherences labeled by $q_e-q_a=\pm1,\pm3$ in FIG. 3D, shown is the experimentally measured mean intensity of light that passes through an cell with alkali-metal vapor that is optically pumped with light modulated as sketched in FIG. 3D. One horizontal axis is proportional to the detuning of the hyperfine drive frequency $\Omega_H$ from the hyperfine resonance frequency $\omega_h$. The second horizontal axis is proportional to the detuning of the Zeeman drive frequency $\Omega_Z$ from the Zeeman resonance frequency $\omega_z$. The sharp, two-dimensional resonance can be used to stabilize a magnetic field and a clock frequency simultaneously.

FIG. 4B shows the resonances produced when every other micropulse of the push-pull pumping beam is eliminated so the atoms were pumped with modulated light of fixed circular polarization $e_a=e_e\propto y\pm iz$ so $\langle f'm'|\delta H|fm\rangle \propto \langle f'm'|S_x|fm\rangle$ for $f'-f=0,\pm1$. Light with fixed circular polarization can generate the Zeeman coherences of the tilted end state through Raman transitions like those indicated by the dashed lines on FIG. 4D. The dashed-line Raman transitions are not excited by the push-pull pumping, with alternating micropulse polarization. The resonance corresponding to the tilted 0-0 state is excited by the light of fixed circular polarization but it is weaker than in the case of push-pull pumping. There is a strong resonance corresponding to excitation of the tilted end state for any value of the microwave detuning.

The strong CPT resonance of FIG. 4A can be used to lock the frequencies $v_h$ and $v_z$ to predetermined values. If the microwave frequency $v_h$ is a high harmonic of the Zeeman frequency $v_z$, the system provides an atomic clock with a stabilized magnetic field. The tilted 0-0 resonance can also be used in frequency-stabilized magnetometers.

The hyperfine resonance frequency $\omega_h$ has a weak, quadratic dependence on the magnetic field. FIG. 5 shows three possible resonances for atomic clocks denoted as: Multi-coherent resonances of the present invention, conventional 0-0 clock resonances and end resonances which include use of the very high signal-to-noise ratios and near immunity to spin-exchange collisions of atoms in the end states of alkali-metal atoms, as described in U.S. Pat. No. 6,917,770, hereby incorporated by reference into this application.

In FIG. 5, the vertical axis is the magnitude of the ambient magnetic field. Plotted on the horizontal axis of FIG. 5 are the shifts of the clock resonance frequency $\omega_h$ from the ideal resonance frequency $\omega_H$ of field-free atoms. Both the conventional 0-0 resonance frequency and the Multi-coherent resonance frequency $\omega_h$ increase quadratically with the magnetic field B. The quadratic shift with magnetic field for the multi-coherent resonance frequency is about half as large as that for the traditional 0-0 resonance frequency. In contrast, the shift of the end resonance frequency is linear with the field and about 1000 times larger than the shifts of the multi-coherent or the 0-0 resonance frequencies at a fid of one Gauss.

Under the proper excitation conditions $\omega_z$ has no quadratic dependence on the magnetic field and the Zeeman resonance frequency $\omega_z$ is linear in the ambient magnetic field thereby providing a multiple quantum transition between the two end states of the atom, which have a purely linear dependence on the magnetic field. The Zeeman resonance frequency can be used as a precise way to measure the ambient magnetic field or as a way to control the ambient field with very high precision.

In an alternate embodiment, pumping with unmodulated circularly polarized light, and exciting the atoms with a comb of microwave frequencies generated from a carrier at the hyperfine frequency $\Omega_H$ and modulated at the Zeeman frequency $\Omega_Z$ can excite the atoms into a state similar to the tilted 0-0 state, as shown in FIGS. 6A-6C. Excitation with multiple-quantum microwave transitions is preferred. Unmodulated, circularly polarized D1 light is used to pump most of the atoms into the end state. The atoms are excited with microwaves, for which the small microwave field $B_1$ is at right angles to the static magnetic field $B_0$. The microwave field is modulated at the frequency $\Omega_Z$ in such a way that a number of sidebands are generated. The sideband frequencies are such that multiple quantum transitions are driven from the right end state to the left end state. Data for multi-coherent resonances excited with multiple quantum microwave transitions is shown in FIG. 7.

In block 14, detection of transmission of the light through the alkali-metal vapor is measured. For example, a photo detector can be used to measure transmission of the light through a glass cell containing the alkali-metal vapor and a buffer gas. Alternatively, fluorescence of the alkali-metal vapor is measured. Alternatively, atomic state of the alkali-metal atoms in an atomic beam is analyzed using standard methods. Method 10 can be used to improve performance of gas-cell atomic clocks, atomic beam clocks, atomic fountain clocks and magnetometers.

It is to be understood that the above-described embodiments are illustrative of only a few of the many possible specific embodiments that can represent applications of the principles of the invention. Numerous and varied other arrangements can be readily devised in accordance with these principles by those skilled in the art without departing from the spirit and scope of the invention.

What is claimed is:

1. A method for operating an atomic clock comprising the steps of:

means for generating atoms in the vapor phase or in an atomic beam;

simultaneously exciting a microwave hyperfine resonance and a Zeeman resonance in said atoms either by:

applying magnetic fields oscillating at a microwave hyperfine frequency and a Zeeman frequency; or pumping the atoms with light modulated at a microwave hyperfine frequency and a Zeeman frequency.

2. The method of claim 1 wherein the atoms are pumped with circularly polarized D1 light.

3. The method of claim 1 wherein the atoms are pumped with circularly polarized D1 resonance light intensity modulated at the Zeeman frequency and circular polarization of the light alternates in sign at the microwave hyperfine frequency wherein a magnetic field a clock frequency of said atomic clock are simultaneously controlled.

4. A method for operating an atomic clock comprising the steps of:

means for generating atoms in the vapor phase or in an atomic beam:

simultaneously exciting a microwave hyperfine resonance and a Zeeman resonance in said atoms either by:

applying magnetic fields oscillating at a microwave hyperfine frequency and a Zeeman frequency; or pumping the atoms with light modulated at a microwave hyperfine frequency and a Zeeman frequency wherein the atoms are pumped with circularly polarized D1 resonance light intensity modulated at the Zeeman frequency and circular polarization of the light alternates in sign at the microwave hyperfine frequency;

wherein a magnetic field and a clock frequency of said atomic clock are simultaneously controlled and wherein said light is pulse modulated in which pulses are separated by half of a hyperfine period.

5. The method of claim 1 wherein the magnetic fields are excited with atoms generated by a microwave field at right angles to a static magnetic field.

6. The method of claim 1 further comprising the step of:

detecting transmission of the light through a medium including the atoms.

7. The method of claim 1 further comprising the step of:

detecting fluorescence of the atoms excited by the light of alternating polarization.

8. The method of claim 1 wherein the Zeeman frequency is an integer subharmonic of the hyperfine frequency.

9. The method of claim 1 wherein the atoms are rubidium atoms or cesium atoms.

10. A system for operating an atomic clock comprising:

means for generating atoms in the vapor phase or in an atomic beam;

means for simultaneously exciting a microwave hyperfine resonance and a Zeeman resonance in said atoms either by:

means for applying magnetic fields oscillating at a microwave hyperfine frequency and a Zeeman frequency; or means for pumping the atoms with light modulated at a microwave hyperfine frequency and a Zeeman frequency.

11. The system of claim 10 wherein the atoms are pumped with circularly polarized D1 light.

12. The system of claim 10 wherein the atoms are pumped with circularly polarized D1 resonance light intensity modulated at the Zeeman frequency and circular polarization of the light alternates in sign at the microwave hyperfine frequency wherein a magnetic field and a clock frequency of said atomic clock are simultaneously controlled.

13. A system for operating an atomic clock comprising:

means for generating atoms in the vapor phase or in an atomic beam;

means for simultaneously exciting a microwave hyperfine resonance and a Zeeman resonance in said atoms either by:

means for applying magnetic fields oscillating at a microwave hyperfine frequency and a Zeeman frequency; or means for pumping the atoms with light modulated at a microwave hyperfine frequency and a Zeeman frequency wherein the atoms are pumped with circularly polarized D1 resonance light intensity modulated at the Zeeman frequency and circular polarization of the light alternates in sign at the microwave hyperfine frequency;

wherein a magnetic field and a clock frequency of said atomic clock are simultaneously controlled and wherein said light is pulse modulated in which pulses are separated by half of a hyperfine period.

14. The system of claim 10 wherein the magnetic fields are excited with atoms generated by a microwave field at right angles to a static magnetic field.

15. The system of claim 10 further comprising:

means for detecting transmission of the light through a medium including the atoms.

16. The system of claim 10 further comprising:

means for detecting fluorescence of the atoms excited by the light of alternating polarization.

17. The system of claim 10 wherein the Zeeman frequency is an integer subharmonic of the hyperfine frequency.

18. The system of claim 10 wherein the atoms are rubidium atoms or cesium atoms.

19. A method for operating a magnetometer comprising the steps of:

generating atoms in the vapor phase or in an atomic beam simultaneously exciting a microwave hyperfine resonance and a Zeeman resonance in said atoms either by:

applying magnetic fields oscillating at a microwave hyperfine frequency and a Zeeman frequency; or pumping the atoms with light modulated at a microwave hyperfine frequency and a Zeeman frequency.

20. The method of claim 19 wherein the atoms are pumped with circularly polarized D1 light.

21. The method of claim 19 wherein the atoms are pumped with circularly polarized D1 resonance light intensity modulated at the Zeeman frequency and circular polarization of the light alternates in sign at the microwave hyperfine frequency wherein a magnetic field and a clock frequency of said atomic clock are simultaneously controlled.

22. A method for operating a magnetometer comprising the steps of:

generating atoms in the vapor phase or in an atomic beam simultaneously exciting a microwave hyperfine resonance and a Zeeman resonance in said atoms either by:

applying magnetic fields oscillating at a microwave hyperfine frequency and a Zeeman frequency; or pumping the atoms with light modulated at a microwave hyperfine frequency and a Zeeman frequency wherein the atoms are pumped with circularly polarized D1 resonance light intensity modulated at the Zeeman frequency and circular polarization of the light alternates in sign at the microwave hyperfine frequency;

wherein a magnetic field and a clock frequency of said atomic clock are simultaneously controlled and wherein said light is pulse modulated in which pulses are separated by half of a hyperfine period.

23. The method of claim 19 wherein the magnetic fields are excited with atoms generated by a microwave field at right angles to a static magnetic field.

24. The method of claim 19 further comprising the step of:

detecting transmission of the light through a medium including the atoms.

25. The method of claim 19 further comprising the step of:

detecting fluorescence of the atoms excited by the light of alternating polarization.

26. The method of claim 19 wherein the Zeeman frequency is an integer subharmonic of the hyperfine frequency.

27. The method of claim 19 wherein the atoms are rubidium atoms or cesium atoms.

28. A system for operating a magnetometer comprising the steps of:

means for generating atoms in the vapor phase or in an atomic beam simultaneously exciting a microwave hyperfine resonance and a Zeeman resonance in said atoms either by:

means for applying magnetic fields oscillating at a microwave hyperfine frequency and a Zeeman frequency; or means for pumping the atoms with light modulated at a microwave hyperfine frequency and a Zeeman frequency.

29. The system of claim 28 wherein the atoms are pumped with circularly polarized D1 light.

30. The system of claim 28 wherein the atoms are pumped with circularly polarized D1 resonance light intensity modulated at the Zeeman frequency and circular polarization of the light alternates in sign at the microwave hyperfine frequency wherein a magnetic field and a clock frequency of said atomic clock are simultaneously controlled.

31. A system for operating a magnetometer comprising the steps of:

means for generating atoms in the vapor phase or in an atomic beam simultaneously exciting a microwave hyperfine resonance and a Zeeman resonance in said atoms either by:

means for applying magnetic fields oscillating at a microwave hyperfine frequency and a Zeeman frequency; or means for pumping the atoms with light modulated at a microwave hyperfine frequency and a Zeeman frequency wherein the atoms are pumped with circularly polarized D1 resonance light intensity modulated at the Zeeman frequency and circular polarization of the light alternates in sign at the microwave hyperfine frequency;

wherein a magnetic field and a clock frequency of said atomic clock are simultaneously controlled and wherein said light is pulse modulated in which pulses are separated by half of a hyperfine period.

32. The system of claim 28 wherein the magnetic fields are excited with atoms generated by a microwave field at right angles to a static magnetic field.

33. The system of claim 28 further comprising:

means for detecting transmission of the light through a medium including the atoms.

34. The system of claim 28 further comprising:

means for detecting fluorescence of the atoms excited by the light of alternating polarization.

35. The system of claim 28 wherein the Zeeman frequency is an integer subharmonic of the hyperfine frequency.

36. The system of claim 28 wherein the atoms are rubidium atoms or cesium atoms.

* * * * *